(12) United States Patent
Tai et al.

(10) Patent No.: US 6,786,737 B2
(45) Date of Patent: Sep. 7, 2004

(54) ELECTRICAL CONNECTING ELEMENT AND METHOD OF PRODUCING THE SAME

(75) Inventors: Tomishige Tai, Tokyo (JP); Mitsuo Koguchi, Tokyo (JP)

(73) Assignee: Japan Aviation Electronics Industry Limited (JP)

( * ) Notice: Subject to any disclaimer, the term of this patent is extended or adjusted under 35 U.S.C. 154(b) by 0 days.

(21) Appl. No.: 10/167,415

(22) Filed: Jun. 13, 2002

(65) Prior Publication Data

US 2002/0151196 A1 Oct. 17, 2002

Related U.S. Application Data

(62) Division of application No. 09/714,503, filed on Nov. 17, 2000.

(30) Foreign Application Priority Data

Nov. 18, 1999 (JP) ............................................. 11-328234
Aug. 11, 2000 (JP) ....................................... 2000-243950

(51) Int. Cl.[7] .............................................................. H01R 9/09
(52) U.S. Cl. ............................... 439/67; 439/91; 29/848
(58) Field of Search ............................. 439/66, 67, 91; 174/254; 29/848

(56) References Cited

U.S. PATENT DOCUMENTS 4,908,016 A    3/1990  Tada et al. ................... 156/629
5,219,655 A    6/1993  Calhoun et al. ............. 428/344
5,328,534 A    7/1994  Calhoun et al. ............. 156/150
5,338,209 A  * 8/1994  Brooks ......................... 439/66

FOREIGN PATENT DOCUMENTS

| EP | 60/264214 | 12/1985 |
|----|-----------|---------|
| EP | 63/272095 | 11/1988 |
| EP | 63/284886 | 11/1988 |
| JP | 61-240511 | 10/1985 |
| JP | 05-075248 | 3/1993  |
| JP | 05-275834 | 10/1993 |
| JP | 06-202309 | 7/1994  |
| JP | 10-319222 | 12/1998 |

* cited by examiner

Primary Examiner—Neil Abrams
(74) Attorney, Agent, or Firm—Connolly Bove Lodge & Hutz LLP

(57) ABSTRACT

A metallic thin film 15 is formed on a mold 11 having protrusions 12 complementary in shape to a conductor pattern to be formed; a substrate 17 having a transfer layer 16 of adherent (or adhesive) material applied to one side surface thereof is provided; and the transfer layer 16 side of the substrate is brought into intimate contact with the metallic thin film 15 laid over the protrusions 12, followed by pulling the transfer layer apart from the mold so as to transfer the metallic thin film 15 covering the protrusions 12 onto the transfer layer 16 to thereby form the conductor pattern 18 on the transfer layer 16. The metal film may include cooper and a weak adherence layer 13 which may be gold.

4 Claims, 10 Drawing Sheets

ELECTRICAL CONNECTING ELEMENT AND METHOD OF PRODUCING THE SAME

This application is a divisional of U.S. patent application Ser. No. 09/714,503, filed Nov. 17, 2000, which is now pending.

BACKGROUND OF THE INVENTION

This invention relates to electrical connecting elements such as connectors for electrically connecting wiring or circuit boards with each other, and anisotropic conductive elements for interconnecting terminals, electrodes, etc. on flexible printed wiring or circuit boards such as flat cables and circuit boards, and a method of producing the same.

Heretofore, the prior art connectors for electrically connecting wiring boards with each other, for example have generally required mechanisms/members for mechanically fixing the connectors and the wiring boards and maintaining the boards connected as well as members for establishing the connection. Conventional connectors having such mechanical coupling means have been correspondingly complicated in structure, resulting in hampering the miniaturization and slimming-down. Japanese Patent Publication No. 7-220846 issued Aug. 18, 1995 discloses producing a connector by bonding a metallic thin sheet to an insulating cushioning material and laser-machining channels in the metallic thin sheet, followed by bending the assembly perpendicularly to the channel machining direction into a U-shape with the cushioning material facing inward. This required machining channels by laser on connectors one by one, rendering the manufacturing process cumbersome.

On the other hand, to take the conventional manufacturing of flexible printed wiring boards (FPC) by example, the process involves forming a required conductor pattern on a substrate (base film), followed by laying a covering over the conductor pattern to protect and insulate the latter. However, it required a dedicated adhesive to bond the covering to the substrate, and involved an additional step to apply the adhesive.

Accordingly, it is an object of this invention to provide an electrical connecting element which is easy to manufacture, and a method of producing the same.

Another of this invention is to provide an electrical connecting element which is of simple construction and allows for reduction in size and thickness, and a method of producing the same.

SUMMARY OF THE INVENTION

According to one aspect of this invention, a metallic thin film is formed on a mold having protrusions complementary in shape to a conductor pattern to be formed, and a transfer layer of adherent (or sticky) material or adhesive material is applied to the metallic thin film laid over the protrusions, followed by pulling the transfer layer apart from the mold so as to transfer the metallic thin film covering the protrusions onto the transfer layer to thereby form the conductor pattern on the transfer layer.

Alternatively, the transfer layer may be applied to one side surface of the substrate. The term "adherent material" used herein refers to the material with which two objects will be bonded together in such a manner that they may be subsequently peeled apart at the joined surfaces while the term "adhesive material" used herein refers to the material with which two objects will be bonded together in such a manner that they may be hardly peeled apart at the joined surfaces.

In an alternative embodiment, the metallic thin film may be of multilayer construction including a prime layer having a weak adhesion to the mold.

The electrical connecting element according to this invention comprises a substrate having a transfer layer of adherent material or adhesive material thereon, and a conductor pattern provided on the transfer layer. The conductor pattern is obtained by forming a metallic thin film on a mold having protrusions corresponding to the conductor pattern, adhering the substrate to the metallic thin film laid over the protrusions by means of the transfer layer, followed by pulling the substrate away from the mold so as to have the metallic thin film laid over the protrusions transferred onto the transfer layer to thereby form the conductor pattern thereon.

The connector for use as an electrical connecting element according to this invention for electrically connecting wiring boards with each other comprises a wiring element composed of a substrate having a transfer layer of adherent material or adhesive material applied to one side surface thereof, and a conductor pattern having a plurality of parallel conductor lines formed on the transfer layer. The conductor pattern is obtained by forming a metallic thin film on a mold having ridge-like protrusions corresponding to the array of the conductor lines, adhering the transfer layer side of the substrate to the metallic thin film laid over the protrusions, followed by pulling the substrate away from the mold so as to have the metallic thin film on the protrusions transferred onto the transfer layer to thereby form the conductor pattern thereon, wherein the conductor lines of the conductor pattern is in opposing contact with the respective wiring lines to be connected of the two wiring boards being connected to thereby establish connection between those wiring lines, the substrate being pressed against the two wiring boards such that those portions of the transfer layer between the adjacent conductor lines are adherently (or stickily) attached to the surfaces of the two wiring boards to form a mechanical bond.

In an alternative embodiment, the wiring element may be folded in two along a fold line extending in the direction of arrayal (transversely) of the conductor lines of the conductor pattern with the conductor pattern side facing outwardly to form a connector for use as an electrical connecting element. Preferably in this case, the wiring element is folded back by 180° and a spacer or retainer member is sandwiched between the folded legs of the element so that the wiring element may be secured to the retainer member.

In an alternative embodiment, the connector for use as an electrical connecting element comprises two of the wiring element constructed according to this invention. The two wiring elements are bonded together with the conductor patterns of one halves of the respective wiring elements in opposing contact with each other by virtue of the transfer layers of the two wiring elements being adherently attached together while the substrates of the other halves of the respective elements have spacers affixed thereto on the side opposite from the side on which the respective conductor patterns are formed.

The flexible printed wiring board for use as an electrical connecting element according to this invention comprises a covering laid over the surface of the wiring element according to this invention on which the conductor pattern is formed, the covering being bonded to the element by means of the transfer layer.

The anisotropic conductive element for use as an electrical connecting element according to this invention comprises the wiring element according to this invention having a conductor pattern composed of a number of conductor lines arranged parallel to each other at a predetermined pitch, the thus constructed wiring element being cut orthogonally to the length of the conductor lines into strips, a plurality of which are in turn stacked one on another in vertical alignment with each other, the thus built-up strips being pressed together in the direction of stacking to be laminated together in one piece assembly.

A method of producing an anisotropic conductive element for use as an electrical connecting element according to this invention comprises the steps of providing a mold having a multiplicity of grooves formed in the surface thereof in a grid pattern and a multiplicity of protrusions, one extending from the top of each of the rectangular raised sections surrounded by the grooves; forming a metallic thin film on the mold having the protrusions; providing a transfer layer of adherent material or adhesive material having a release sheet applied on one side thereof and penetrating the protrusions of the mold into and through the transfer layer into abutment against the release sheet to thereby bring those portions of the metallic thin film covering the side surfaces of the protrusions and the surfaces of the rectangular raised sections into close contact with the adherent material or adhesive material; pulling the transfer layer together with the release sheet apart from the mold; then removing the release sheet from the transfer layer to complete an anisotropic conductive element having formed thereon a multiplicity of conductor patterns penetrated through and held by adherent material or adhesive material.

DETAILED DESCRIPTION OF THE PREFERRED EMBODIMENTS

Figure 1:
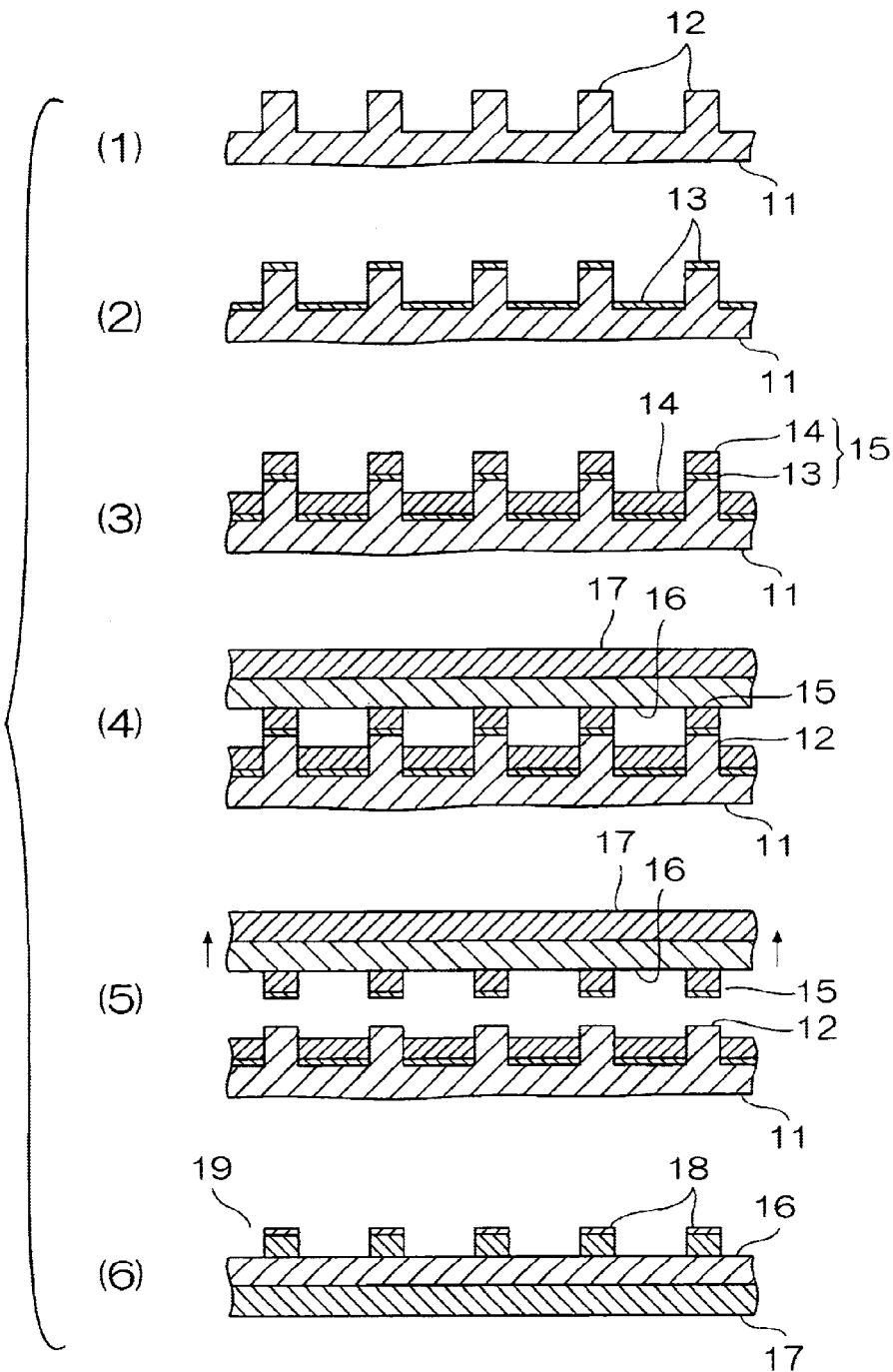
FIG. 1 is a schematic diagram illustrating the sequential steps of one embodiment of the method of producing the electrical connecting element according to this invention.

FIG. 1 illustrates the sequential steps of one embodiment of the method of producing the electrical connecting element according to this invention. The steps will be described specifically below.

Figure 2:
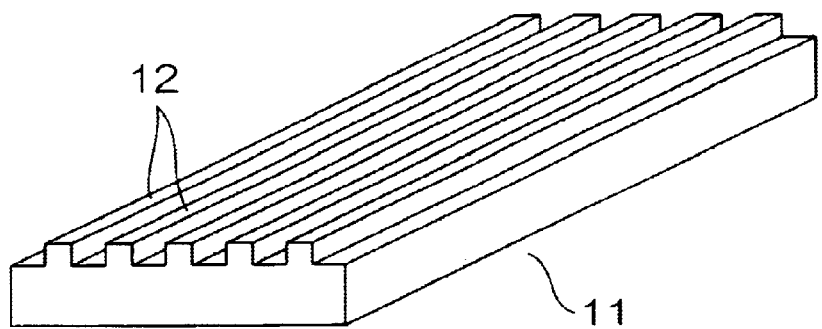
FIG. 2 is a perspective view of the mold 11 shown in FIG. 1.

(1) A mold 11 is provided. The mold 11 has formed in its surface protrusions 12 corresponding to a conductor pattern to be formed. In the example illustrated, the protrusions 12 comprise a plurality of raised ridges arrayed at a predetermined pitch, as shown in FIG. 2, although the raised ridges need not necessarily be arrayed at equal intervals.

(2) First, on the mold 11 a metallic film having a relatively weak adhesion (weak adherent power) to the mold is formed by vapor deposition, sputtering deposition or plating (either electroless plating or electrolytic plating) to provide a prime layer 13.

(3) The next step is to form on this prime layer 13 a main conductor layer 14 in the form of a film to a predetermined thickness from which a conductor pattern are to be formed. This film forming is effected by vapor deposition, sputtering deposition or plating (electroless plating and/or electrolytic plating) to thereby provide a two-ply metallic thin film 15 composed of the prime layer 13 and the main conductor layer 14.

(4) Next, a substrate 17 having a transfer layer 16 of adherent material applied to one side surface thereof is provided. The substrate 17 is oriented with its transfer layer 16 facing toward the mold 11 and the transfer layer 16 is then brought into intimate contact with the metallic thin film 15 on the protrusions 12.

(5) The transfer layer 16 together with the substrate 17 is pulled up away from the mold 11. In doing so, the metallic thin film 15 on the protrusions 12 which is now adherently attached to the transfer layer 16 is peeled apart from the mold 11 at the interface with the mold.

Figure 3:
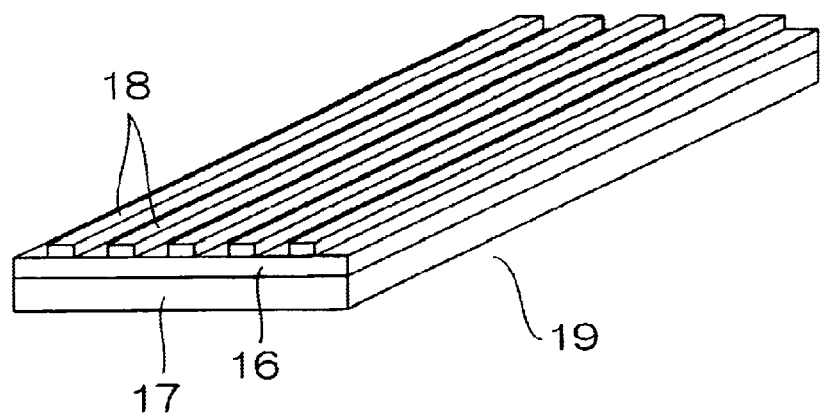
FIG. 3 is a perspective view of an embodiment of the wiring element for use as an electrical connecting element according to this invention manufactured by the process illustrated in FIG. 1.

(6) That is, the metallic thin film 15 on the protrusions 12 is transferred and adherently attached onto the transfer layer 16. It is thus to be appreciated that a wiring element 19 is completed which comprises the substrate 17 and a conductor pattern 18 formed of the metallic thin film 15 transferred onto the transfer layer 16. FIG. 3 shows the entire configuration of the thus completed wiring element 19.

In the method of forming a conductor pattern as described above, gold, tin or carbon which is poorer in adherence to the mold 11 than the main conductor layer 14 may be used for the material of which the prime layer 13 is formed while nickel or copper may be used for the material of which the main conductor layer 14 is formed. Forming the main conductor layer 14 of nickel or copper will provide the conductor pattern 18 which have a desired mechanical strength and which may be provided with conductivity as required. The prime layer 13 need only allow the metallic thin film 15 to be peeled apart from the mold 11 at the interface, and may be very thin even on the order of 0.005 μm. However, if the prime layer 13 is made of gold to enhance the conductivity of the conductor pattern 18, it may be on the order of say 0.05 μm. It is desirable from the viewpoint of mechanical strength that the main conductor layer 14 be more than 3 μm in thickness.

Various materials such as glass, silicon, stainless steel and fluoroplastics may be used for forming the mold 11. When the mold 11 is made of fluoroplastics, which is extremely poor in adhesion to metallic film, a main conductor layer 14 of nickel or copper may be formed directly on the mold 11 without the need for intervening the prime layer 13 as of gold or tin, and the main conductor layer 14 as such may be easily removed from the mold 11 at the interface. The need for the prime layer 13 may also be eliminated by fluoridizing the surface of the mold 11 made of glass, silicon or stainless, or by oxidizing the surface of the mold 11 in the case that the latter is made of silicon.

Concerning the formation of the protrusions 12 on the mold 11, such protrusions 12, if they are in the form of raised ridges as in the example illustrated, may be easily formed in an array at a predetermined pitch by channelling in the surface by the use of a dicing saw, for example. Depending on the configuration and dimensions of the protrusions 12, the etching process may also be utilized. By way of example, when a conductor pattern 18 to be formed is composed of conductor lines of miniscule size and arrayed at a fine pitch, it is possible to adopt such a method as making a mold 11 of silicon and forming protrusions 12 by dry etching utilizing a mask. With the use of a dicing saw, it is possible to make the pitch of protrusions 12 as fine as 100 μm while the use of dry etching allows for making the pitch of protrusions 12 as fine as 1 μm. It is to be noted that the depth of the channels should be greater than the thickness required of the metallic thin film 15.

For the substrate 17, either a flexible substrate such as polyimide resin or the like or a rigid substrate such as glass, epoxy resin or the like may be selectively used depending on the application of the wiring element 19.

While the transfer layer 16 of adherent material maintaining stickiness is disposed on one side surface of the substrate 17 in the example illustrated, the adherent material may be replaced by a transfer layer 16 of adhesive material which will cure after a lapse of a predetermined period of time.

Further, depending on the application, the main conductor layer 14 may be made of gold, in which case the metallic thin film 15 will be formed of a single layer of gold. In addition, in order to ensure symmetry as vertically aligned conductor patterns 18 and to prevent oxidization of the main conductor layer 14 made of nickel or copper, the same metallic film as the prime layer 13 may be additionally formed on the main conductor layer 14, in which case the metallic thin film 15 will be of a three-ply construction of gold/nickel/gold.

Figure 4A:
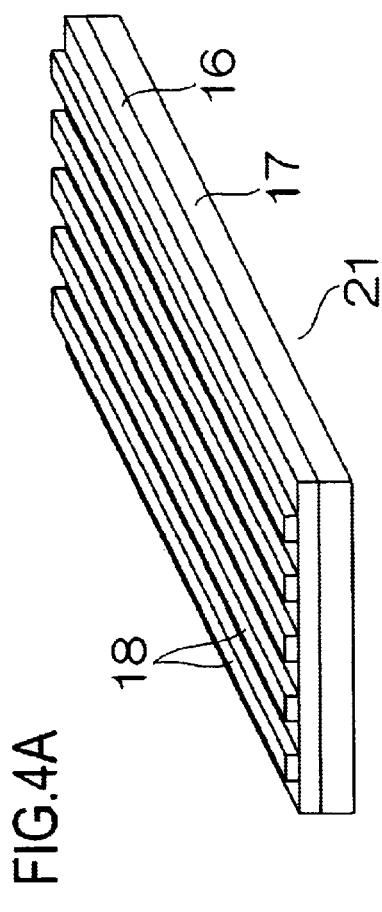
FIG. 4A is a perspective view illustrating an embodiment of the connector for use as an electrical connecting element according to this invention.

FIG. 4 illustrates how a wiring element manufactured by using the conductor pattern forming process as described above (which will be referred to as "transfer method" hereinafter) is used for a connector as an electrical connecting element. As shown in FIG. 4A, the connector 21 includes a conductor pattern 18 comprising a plurality of conductor lines arranged parallel to each other at a predetermined pitch on a transfer layer 16 of adherent material applied to one side surface of a substrate 17.

Figure 4B:
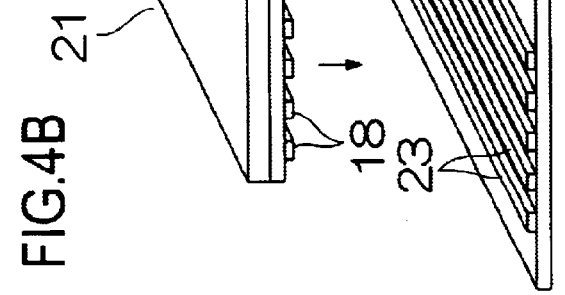
FIGS. 4B and 4C are perspective views illustrating how wiring boards are connected with each other by the connector shown in FIG. 4A.
Figure 4C:
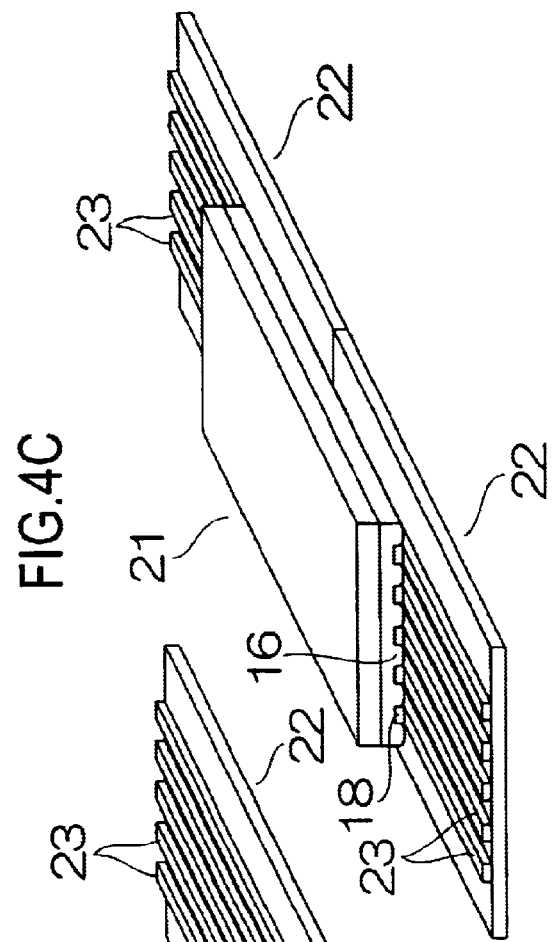

The connector 21 is used to connect two wiring boards 22 with each other as shown in FIG. 4B. The wiring boards 22 are lined end to end such that the wirings 23 at the ends to be connected are in line with each other and the connector 21 is brought into pressure contact with the two wiring boards 22 with the conductor patterns 18 of the connector 21 positioned in opposition to the corresponding wirings 23 to be connected as shown in FIG. 4C. This pressure contact brings the wirings 23 of these two wiring boards 22 into electrical connection with each other as well as forcing the conductor pattern 18 of the connector 21 into the transfer layer 16 whereby those portions of the transfer layer 16 between the conductor pattern 18 are adherently attached to the corresponding surface portions of the two wiring boards 22 to provide mechanical bonding between the connector 21 shown in and the two wiring boards 22. The degree of the bonding by means of the transfer layer 16 may be determined by selecting the thickness of the transfer layer 16 in consideration of the thicknesses of the conductor pattern 18 and the wirings 23.

The transfer layer 16 is subjected to elastic deformation by the conductor pattern 18 forced thereinto to thereby be adherently attached to surface portions of the two wiring boards 22, so that the elastic restoring force of the transfer layer contributes as a load acting in the sense to urge the conductor pattern 18 into contact with the wirings 23 whereby good electrical connection may be established between the conductor pattern 18 and the wirings 23.

The construction of this connector 21 eliminates the need for a separate dedicated member (part) for mechanically securing the connector to the two wiring boards 22 by utilizing the transfer layer 16 not only for forming the conductor pattern 18 through the transfer by virtue of stickiness, but also for providing mechanical securement to the wiring boards 22 to be interconnected. It is thus to be appreciated that the connector 21 according to this invention is simple in construction and may be formed in a very low profile. In addition, it should be understood that the transfer layer 16 may be repeatedly (detachably) used by choosing an appropriate adherent material of which the transfer layer is formed or alternatively that permanent connection may be provided, if desired, by using an adhesive material to form the transfer layer 16.

Figure 5A:
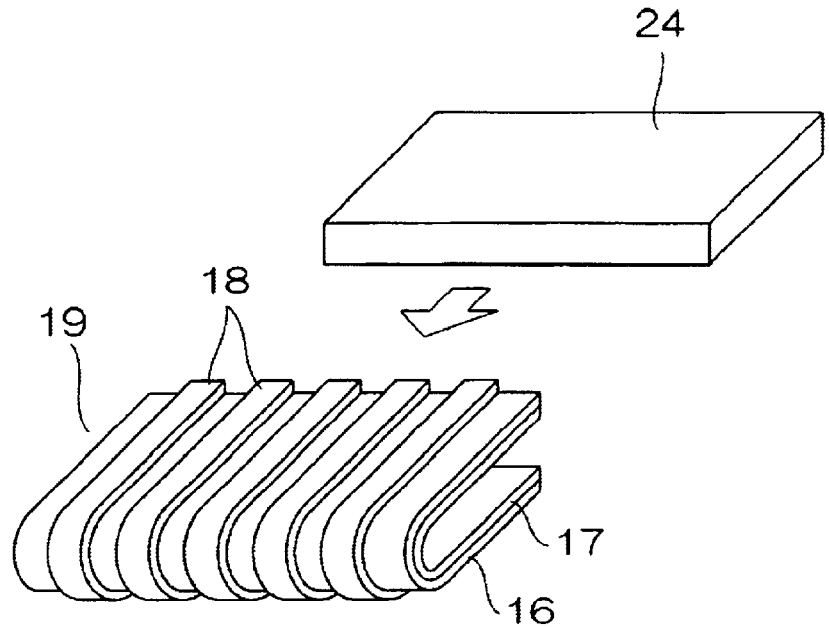
FIG. 5A is a perspective view illustrating another embodiment of the connector for use as an electrical connecting element according to this invention.

FIG. 5 illustrates another embodiment of the connector for use as an electrical connecting element according to this invention in which a wiring element 19 having a conductor pattern 18 comprising a plurality of conductor lines formed in an array by the transfer method as described above is folded by 180° along a fold line extending in the direction of arrayal of the conductor lines with the conductor pattern 18 side facing outwardly and a spacer or retainer member 24 in the form of a thin plate is sandwiched between the folded legs of the element to form a connector 25, as shown in FIG. 5A. The radius of curvature of the fold may be on the order of 0.2 mm, for example.

In the example illustrated, the substrate 17 is in the form of film of polyimide resin, for example or the like which may be easily folded, and has a transfer layer 16 applied on one side surface thereof on which conductor lines are formed in an array to constitute a conductor pattern 18.

The wiring element 19 is maintained in its folded position by the retainer member 24 to which the inner opposed of the folded wiring element 19 are fixed by an adhesive, for example.

The retainer member 24 in the form of a thin plate is made of glass sheet or a sheet of epoxy resin or the like, although it may be formed of an elastic material such as rubber.

Figure 5B:
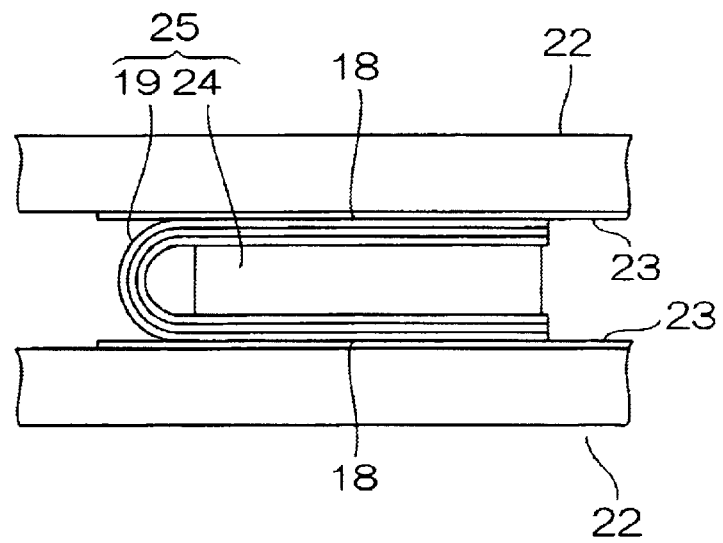
FIG. 5B is a side view illustrating the wiring boards connected with each other by the connector shown in FIG. 5A.

This connector 25 is designed to be sandwiched in use between two wiring boards 22 to be interconnected as shown in FIG. 5B so as to connect the two wiring boards 22 having their wiring faces opposed to each other.

It is thus to be understood that this connector connection is established by sandwiching and compressing the connector 25 between two wiring boards 22 to be connected with the conductor pattern 18 facing in opposition to the wirings 23 of the two wiring boards 22 whereby the mechanical connection as well as electrical connection is effected in the same manner as with the connector 21 illustrated in FIG. 4.

Figure 6A:
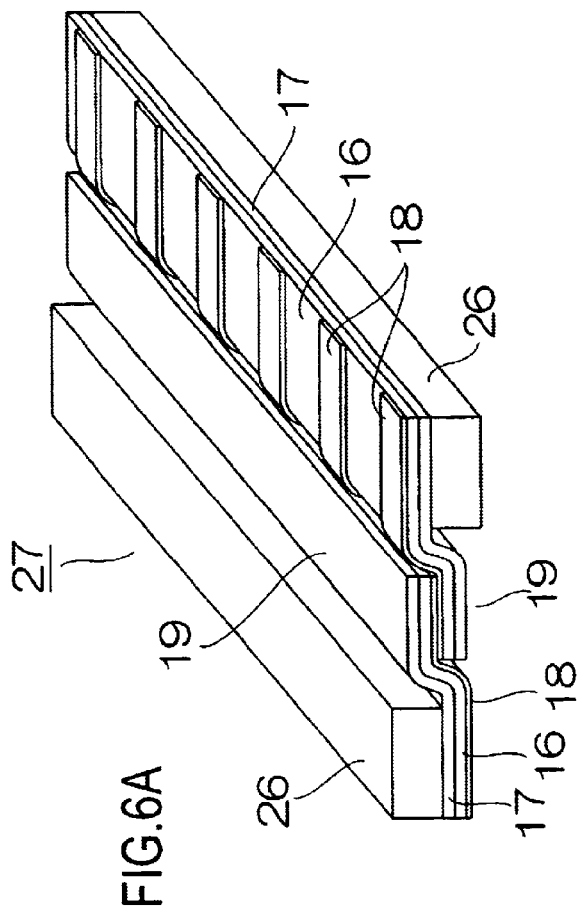
FIG. 6A is a perspective view illustrating yet another embodiment of the connector for use as an electrical connecting element according to this invention.

FIG. 6 illustrates another embodiment of the connector for use as an electrical connecting element for connecting two wiring boards having their wiring faces facing inwardly (but not necessarily facing in opposing relation). In this example, as shown in FIG. 6A, a pair of wiring elements 19 each having a conductor pattern 18 comprising a plurality of conductor lines formed in an array by the transfer method as described above are positioned with the conductor patterns of one halves, as viewed lengthwise of the conductor lines, of the respective elements 19 in opposing contact with each other and bonded together by virtue of the transfer layers of the two wiring elements being adherently attached together as a result of being pressed such that those portions of the outer substrates 17 backing the transfer layers of the one halves are urged toward each other while the substrates 17 of the other halves of the respective wiring elements 19 have spacers 26 affixed thereto on the side opposite from the side on which the conductor patterns 18 are formed.

Figure 6C:
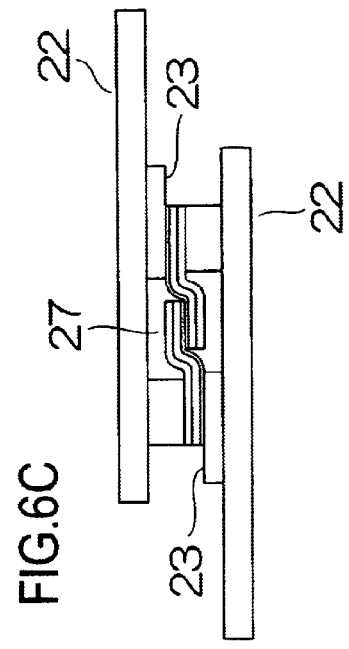
FIG. 6B and 6C are perspective views illustrating how wiring boards are connected with each other by the connector shown in FIG. 6A.
Figure 6B:
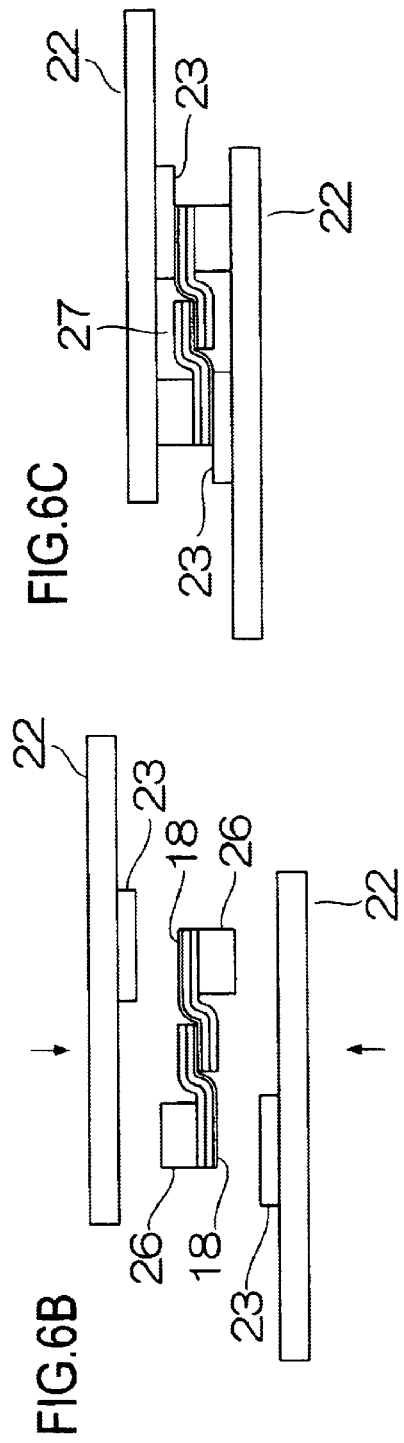

Like the connector 21 shown in FIG. 5, the connector 27 is sandwiched in use between two wiring boards 22 as shown in FIG. 6B wherein the exposed conductor patterns 18 of the other halves of the two wiring elements 19 are opposed to the wirings 23 of the corresponding wiring boards 22 to be connected while the two spacers 26 are pressed on by the respective opposing board surfaces of the wiring boards 22 to bring the conductor patterns 18 and the wirings 23 into pressure contact with each other whereby as shown in FIG. 6C, electrical connection is established between the wirings 23 to be connected while at the same time the transfer layers 16 are adherently attached to the board surfaces of the wiring boards 22 to provide mechanical bond. With this connector, the wiring boards 22 to be interconnected are spaced apart from each other by a distance corresponding to the spacing between the two spacers 26 and need not be opposed to each other.

Figure 7:
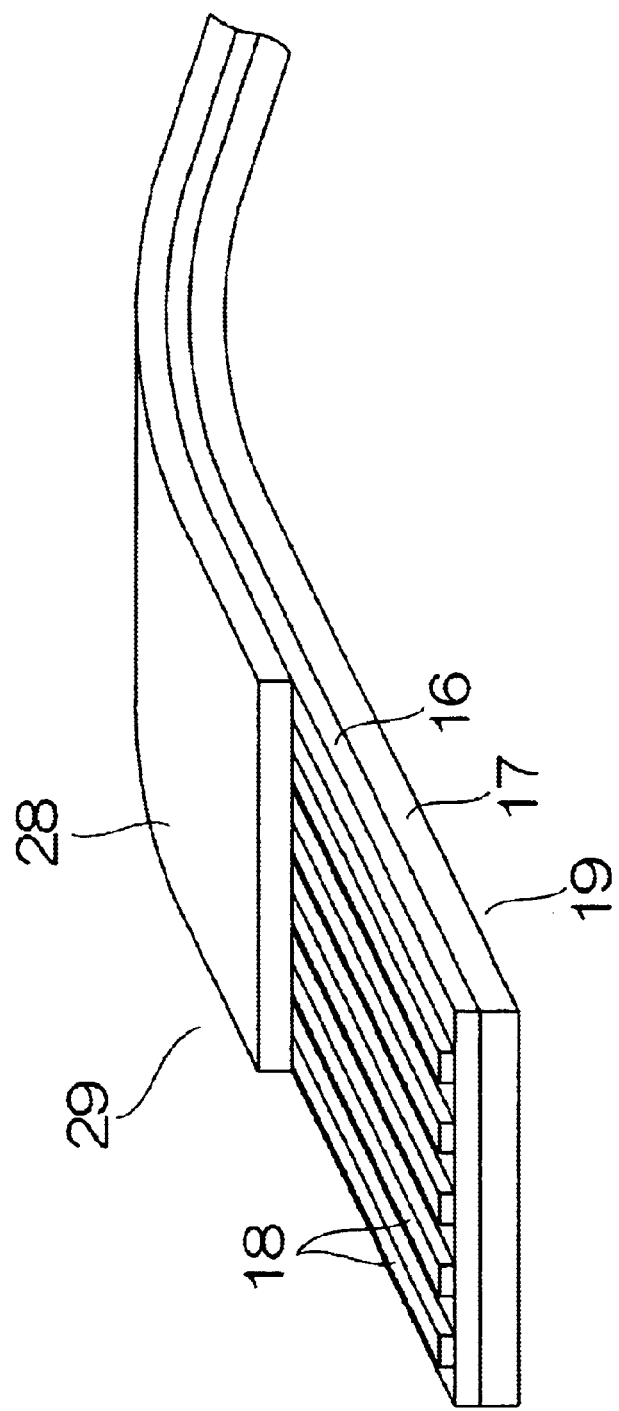
FIG. 7 is a perspective view illustrating an embodiment of the flexible printed wiring board for use as an electrical connecting element according to this invention.

FIG. 7 illustrates an embodiment of the flexible printed wiring board for use as an electrical connecting element according to this invention. In this embodiment the flexible printed wiring board 29 is composed of a wiring element 19 having a conductor pattern 18 comprising a plurality of conductor lines formed by the transfer method as described above and a covering 28 laid over the conductor pattern side surface of the wiring element 19.

By way of example, the covering 28 may be affixed to the wiring element 19 by placing the covering 28 over the conductor pattern 18 and pressing and rolling a roller on the covering to force the conductor pattern 18 into the transfer layer 16 whereby the transfer layer 16 is adherently attached to the covering 28. It is thus to be understood that in this example the covering 28 may be bonded to the wiring element 19 without the need for applying an additional adhesive to the conductor pattern 18 for adhering the covering 28 to them.

The substrate 17 and the covering 28 may be made of polyimide film, for example.

It will be appreciated that in this example an end portion of the wiring element 19 is not covered by the covering 28 so as to expose the end portions of the conductor pattern 18 and transfer layer 16 as shown whereby at this end portion, the wiring element 19 may be readily connected with an electrical element such as an other wiring element or the like to establish bot electrical and mechanical connection.

However, for an application where such joint relying on the adherent property of the transfer layer is required, the adherent (sticky) material may be replaced by an adhesive.

Figure 8A:
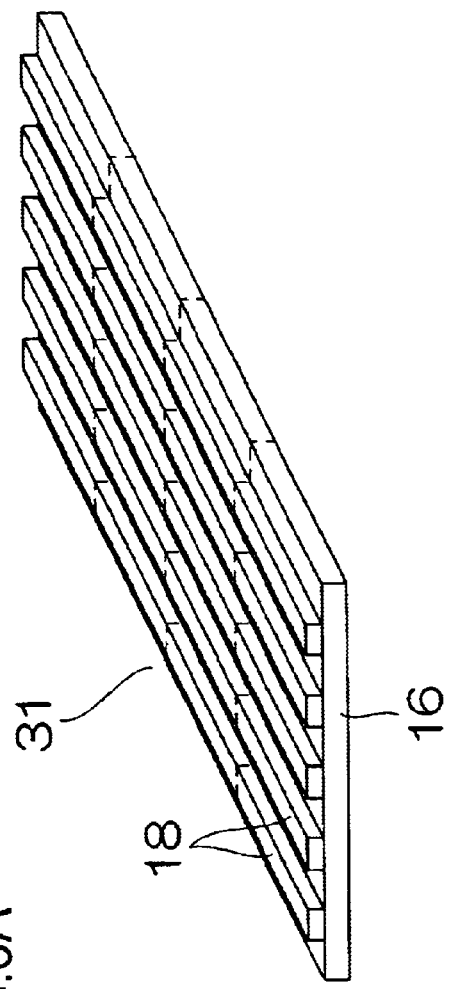
FIG. 8A is a perspective view illustrating another embodiment of the connector stock manufactured by the method according to this invention.

FIG. 8 illustrates an embodiment of the invention in which the transfer layer 16 having a conductor pattern formed thereon lacks a substrate. More specifically, in this example, an anisotropic conductive element for use as an electrical connecting element is formed using a connector stock 31 comprising a transfer layer 16 having a conductor pattern 18 composed of a plurality of conductor lines formed in an array thereon. As shown in FIG. 8A, the stock 31 is manufactured by forming a conductor pattern 18 composed of a plurality of conductor lines arranged in parallel at a predetermined pitch on a transfer layer 16 in the form of a sheet, and the stock is then cut into a plurality of equal lengths of strips 32 transversely as indicated in broken lines in FIG. 8A, that is, orthogonally to the length of the conductor lines.

The transfer layer 16 in the form of a sheet may be made of a material similar to a double-faced adhesive tape, for example which contains a required amount of fibers such as glass fibers.

Figure 8C:
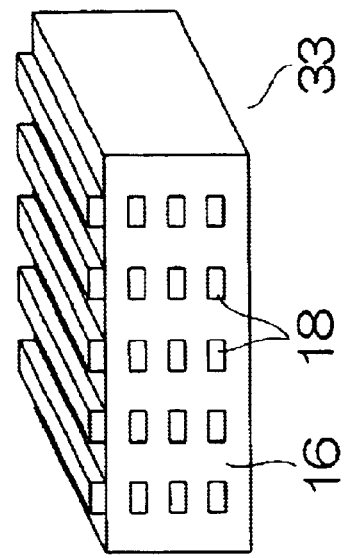
FIG. 8C is a perspective view illustrating an embodiment of the anisotropic conductive element for use as an electrical connecting element according to this invention.
Figure 8B:
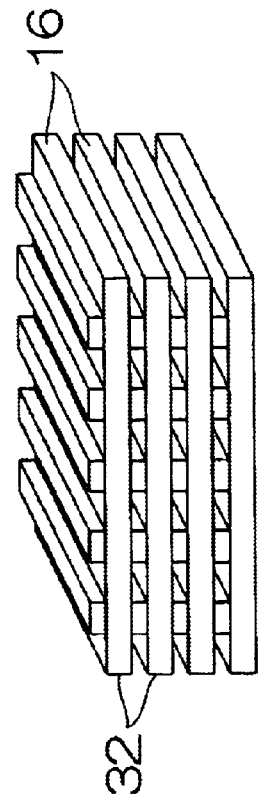
FIG. 8B is a perspective view illustrating strips cut from the stock shown in FIG. 8A being stacked one on another.

Those strips 32 are stacked one on another in shown in FIG. 8B and the thus built up strips 32 are compressed together in the direction of stacking to be laminated together, whereby the adherent materials 16 of the strips 32 with the conductor patterns 18 embedded therein are integrated in one piece assembly as shown in FIG. 8C to form an anisotropic conductive element 33.

The anisotropic conductive element 33 is provided with anisotropic conductivity by a multiplicity of conductor patterns 18 held in an array, and may be interposed between two electrodes to be connected such that the opposite end faces of the conductor patterns 18 of the one piece built-up assembly are in contact with the two electrodes whereby the electrodes may not only be connected for conduction of electricity through only those portions in contact with the anisotropic conductive element 33 but also be mechanically coupled together due to the adherent attachment of the transfer layer 16 to the electrodes.

As is apparent from the embodiment illustrated in FIG. 8A, the substrate 17 is not necessarily used, and accordingly the substrate 17 may be eliminated in the connectors shown in FIGS. 5 and 6.

Now, the method for producing the anisotropic conductive element will be described as another embodiment of the method (transfer method) for forming a conductor pattern according to this invention.

Figure 9:
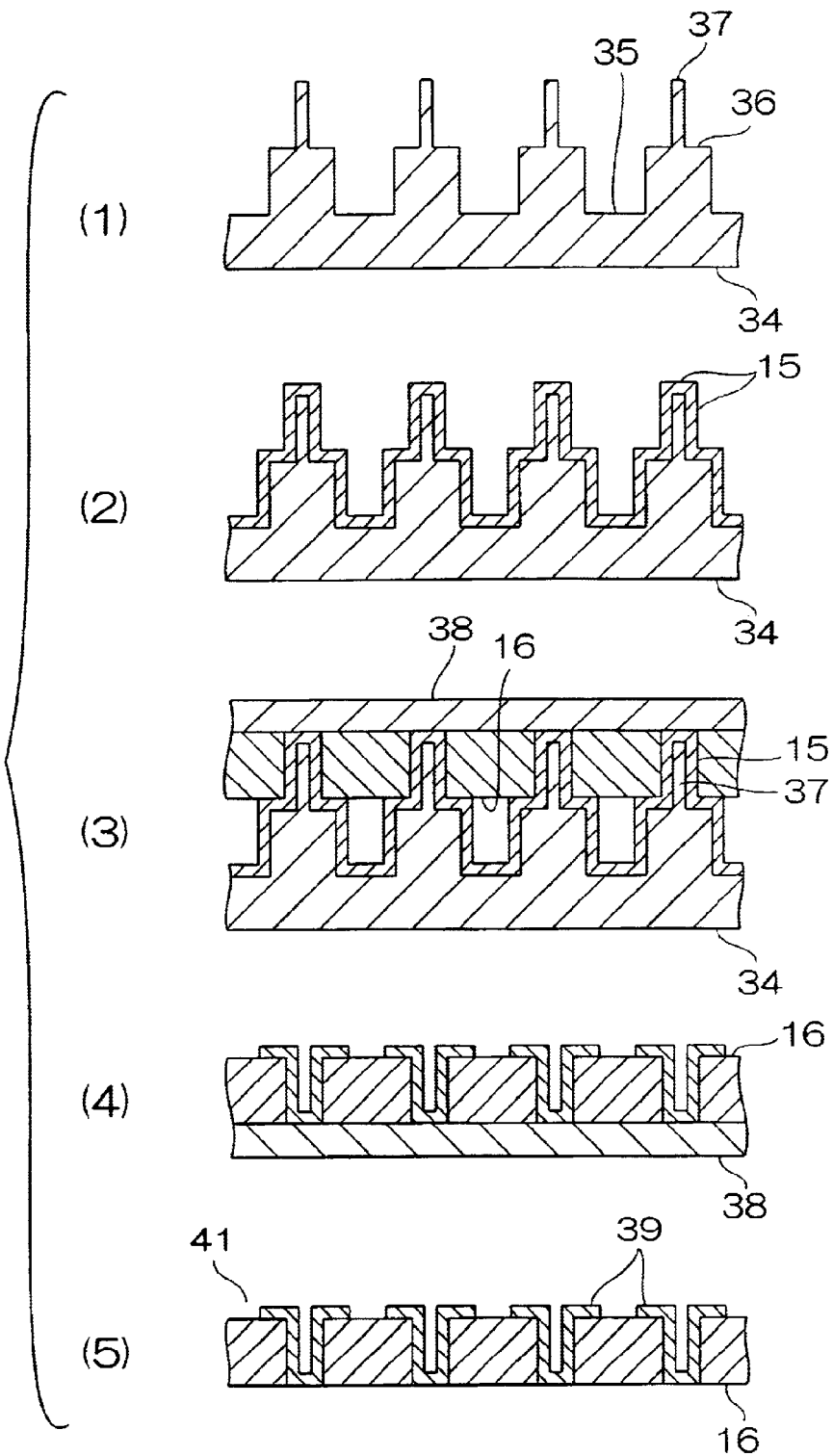
FIG. 9 is a schematic diagram illustrating the sequential steps of another embodiment of the method of producing the electrical connecting element according to this invention.

FIG. 9 illustrates the sequential steps of the process of producing the anisotropic conductive element, each step of which will be described below.

Figure 10:
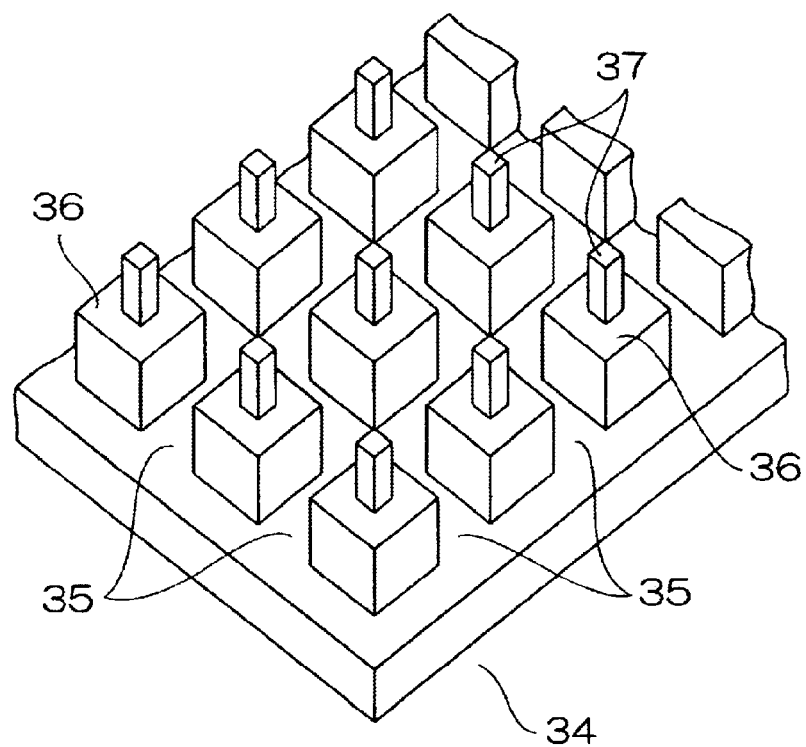
FIG. 10 is a perspective view showing a part of the mold 11 shown in FIG. 9.

(1) A mold 34 is provided. In this example, the mold 34 has a molding surface as shown in FIG. 10 which comprises a multiplicity of grooves 35 arranged in a grid pattern and a multiplicity of protrusions 37, one extending from generally the center of the top of each of the rectangular raised sections 36 surrounded by the grooves 35.

(2) The next step is to form a metallic thin film 15 on the molding surface of the mold 34. While the metallic thin film 15 is shown in a simplified form as being a single-ply layer, it may be one that comprises a prime layer and a main conductor layer like the metallic thin film 15 shown in FIG. 1. Further, it should be noted that in this example the metallic film is coated over not only the horizontal surfaces of the mold 34 but also the vertical surfaces. For the materials of which metallic thin film 15 and the mold 34 are made, the materials described with reference to FIG. 1 may be selected.

(3) A transfer layer 19 of adherent material having a release sheet (separator) 38 comprising a double-face adhesive tape having applied on one side surface thereof is provided. With the other side surface opposing the mold 34, the protrusions 37 of the mold 34 are penetrated into and through the transfer layer 16 until the top ends of the protrusions 37 come into abutment against the release sheet 38, whereby those portions of the metallic thin film 15 covering the side surfaces of the protrusions 37 and the surfaces of the rectangular raised sections 36 are brought into intimate contact with the transfer layer 16.

(4) Then, by pulling the transfer layer 16 together with the release sheet 38 apart from the mold, those portions of the metallic thin film 15 adherently attached to the side portions (also including the top surfaces) of the protrusions 37 and the surfaces of the rectangular raised sections 36 are peeled apart from the mold 34 at the interface with the mold.

(5) Finally, the release sheet 38 is removed from the transfer layer 16 to complete an anisotropic conductive element 41 having formed thereon a conductor pattern 39 composed of a multiplicity of conductor 39 penetrated through and held by the transfer layer 16. Specifically, as shown in FIG. 9 (4), (5), each of the conductors comprises a tubular section adherently formed around the inner peripheral surface of corresponding one of the through-bores formed through the transfer layer 16, a closure closing one end (bottom end) of the tubular section, and a flange section continuously extending from the other end (top end) of the tubular section and adherently attached to one side surface of the transfer layer 16. It is to be noted that the transfer layer 16 is the one which contains fibers such as glass fibers as with the transfer layer 16 shown in FIG. 8.

Figure 11:
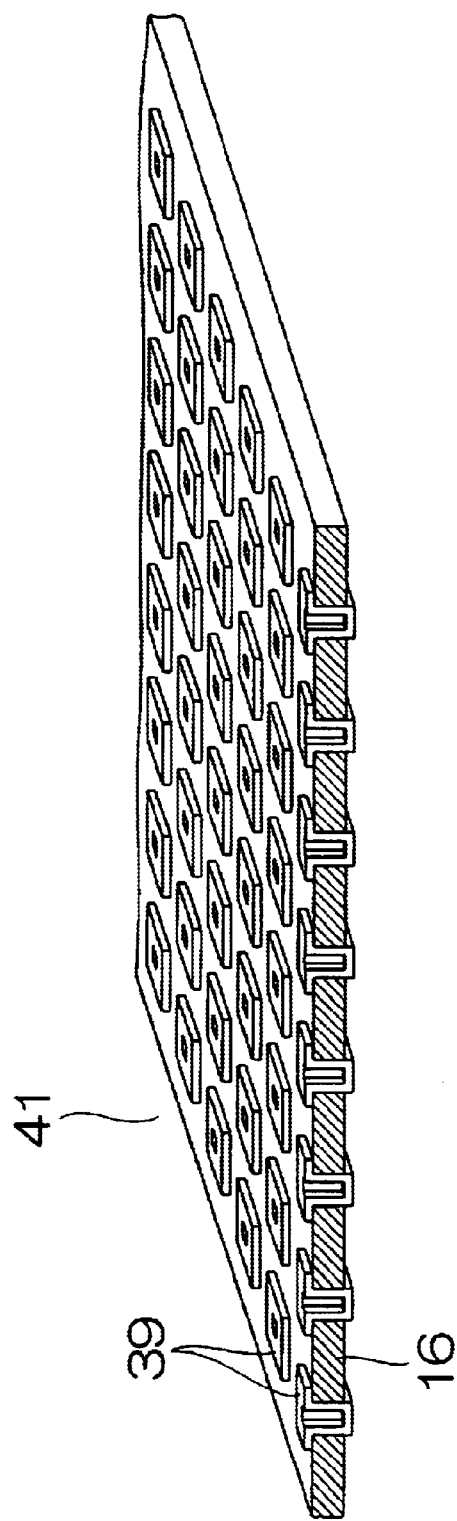
FIG. 11 is a perspective view illustrating another embodiment of the anisotropic conductive element for use as an electrical connecting element according to this invention.

FIG. 11 illustrates the construction of the anisotropic conductive element 41 produced as described above wherein a conductor pattern 39 comprises a multiplicity of conductors in the form of through-conductors arranged in a grid pattern penetrated in and held by the transfer layer 16.

It is noted that as with the anisotropic conductive element 33, this anisotropic conductive element 41 is also configured to conveniently and effectively provide mechanical connection as well as electrical connection due to the transfer layer 16 adherently attaching to electrodes, for example.

As is appreciated from the foregoing, this invention allows for easily forming a conductor pattern on a transfer layer or a layer of adhesive which has heretofore difficult by the adoption of the transfer method involving peeling a metallic thin film formed on a mold apart from the mold at the interface.

It should also be noted that the transfer layer on which a conductor pattern is to be formed is not subject to special limitations in choosing the material for the transfer layer since it is not exposed to either high temperature or chemicals, for example during the manufacturing process. Accordingly, the type of the material for the transfer layer may be selected as required.

According to the method of this invention, once a mold has been made, it is possible to form a conductor pattern corresponding in configuration to the mold repeatedly and with good precision. Additionally, this method allows for forming a conductor pattern of extremely narrow or fine conductor lines as well as very closely spaced conductor lines. Moreover, it is easy to render the metallic thin film formed on the mold extremely thin by controlling the film forming process, so that it is possible to form even an extremely thin film successfully.

The use of this method for forming a conductor pattern to manufacture a connector allows for production of a compact and low profile connector of simple construction by utilizing an adherent material as a mechanical coupling means with opponent wiring boards, for example.

In addition, the use of this method for forming a conductor pattern to manufacture a flexible printed wiring board makes it possible to bond the covering directly to the wiring element without the need for applying an additional adhesive as in the prior art and facilitates connection with opponent wiring elements to be connected by means of the transfer layer.

Moreover, the use of the method for adherently transferring a metallic thin film formed on a mold onto a sheet-like transfer layer by causing the metallic film to penetrate into the transfer layer facilitates the production of an anisotropic conductive element having a multiplicity of through-conductors held by the transfer layer.

What is claimed is:

1. An electrical connecting element comprising:
    a transfer layer made of either one of adherent material and adhesive material;
    a conductor pattern adherently attached to said transfer layer by means of adherent power of the transfer layer itself;
    wherein said conductor pattern comprises a plurality of conductor lines arranged in an array; and including two of said transfer layer each having said conductor pattern adherently attached thereto; and wherein
        one halves, as viewed lengthwise of the conductor lines, of the conductor patterns of the two transfer layers are positioned in opposing contact with each other such that those portions of said two transfer layers between said conductor patterns are adherently attached together; and including spacers attached to the surfaces of the other halves of the conductor patterns of the two transfer layers on the side opposite from the respective conductor patterns; and
        those portions of said conductor patterns lying on the surfaces of said two transfer layers opposite from the side on which the respective spacers are attached constitute connecting portions, respectively.

2. The electrical connecting element of claim 1 wherein said conductor pattern is formed by being transferred and adherently attached to said transfer layer.

3. The electrical connecting element of claim 2 wherein said conductor pattern is formed by forming a metallic thin film on a mold having protrusions corresponding to the conductor pattern, adhering said transfer layer to the metallic thin film laid over said protrusions, followed by pulling the transfer layer away from the mold so as to have the metallic thin film laid over the protrusions transferred onto the transfer layer.

4. The electrical connecting element of claim 1 wherein said conductor pattern includes a first metallic layer on the side opposite from said transfer layer, said first metallic layer having a relatively weak adherent power to an other object and a second metallic layer adjoining the first metallic layer on the side of said transfer layer, said second metallic layer having a stronger adherent power to the other object than said first metallic layer has.

* * * * *